(12) United States Patent
Kim et al.

(10) Patent No.: US 11,024,612 B2
(45) Date of Patent: Jun. 1, 2021

(54) DISPLAY DEVICE

(71) Applicant: LG ELECTRONICS INC., Seoul (KR)

(72) Inventors: Donghyun Kim, Seoul (KR); Dongjin Yoon, Seoul (KR); Sangtae Park, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/636,632

(22) PCT Filed: Dec. 20, 2017

(86) PCT No.: PCT/KR2017/015113
§ 371 (c)(1),
(2) Date: Feb. 4, 2020

(87) PCT Pub. No.: WO2019/031662
PCT Pub. Date: Feb. 24, 2019

(65) Prior Publication Data
US 2020/0373280 A1 Nov. 26, 2020

(30) Foreign Application Priority Data
Aug. 8, 2017 (KR) .................. 10-2017-0100418

(51) Int. Cl.
*H01L 25/075* (2006.01)
*H01L 33/54* (2010.01)
*H01L 33/62* (2010.01)

(52) U.S. Cl.
CPC .......... *H01L 25/0753* (2013.01); *H01L 33/54* (2013.01); *H01L 33/62* (2013.01)

(58) Field of Classification Search
CPC ..... H01L 25/0753; H01L 33/54; H01L 33/62; G02F 1/1333; G06F 3/14; G09F 9/302
See application file for complete search history.

(56) References Cited

U.S. PATENT DOCUMENTS

| | | | |
|---|---|---|---|
| 4,445,132 A * | 4/1984 | Ichikawa | .................. G09F 9/33 257/13 |
| 10,355,186 B2 * | 7/2019 | Corwin | ............... H01L 25/0753 |

(Continued)

FOREIGN PATENT DOCUMENTS

| | | |
|---|---|---|
| EP | 2879120 | 6/2015 |
| JP | 2005181703 | 7/2005 |

(Continued)

OTHER PUBLICATIONS

PCT International Application No. PCT/KR2017/015113, International Search Report dated May 23, 2018, 3 pages.

(Continued)

*Primary Examiner* — Victor A Mandala
(74) *Attorney, Agent, or Firm* — Lee, Hong, Degerman, Kang & Waimey PC

(57) ABSTRACT

A display device according to the present invention comprises: a light-transmissive substrate including one surface; a first anode formed on the one surface and extended to be long; a first cathode formed on the one surface and facing the first anode; a second cathode formed on the one surface, facing a second anode, and located between the first anode and the first cathode; the second anode formed on the one surface, facing the second cathode, and located between the second cathode and the first cathode; first light sources provided on the one surface and located between the first anode and the second cathode; second light sources located between the second cathode and the second anode; third light sources located between the second anode and the second cathode; a first connector separated from the one surface while facing the one surface, and connecting the first anode and the second anode; and a second connector separated from the one surface while facing the one surface, and connecting the first cathode and the second cathode.

10 Claims, 24 Drawing Sheets

(56) References Cited

U.S. PATENT DOCUMENTS

| | | | |
|---|---|---|---|
| 2005/0082673 A1* | 4/2005 | Fujiwara | B41J 2/45 257/758 |
| 2015/0214441 A1* | 7/2015 | Chen | H01L 33/502 257/88 |
| 2017/0068362 A1 | 3/2017 | Den Boer et al. | |
| 2017/0084809 A1* | 3/2017 | Jiang | H01L 33/56 |
| 2018/0084614 A1* | 3/2018 | Bower | H05B 45/50 |
| 2018/0211945 A1* | 7/2018 | Cok | G09G 3/32 |
| 2020/0083415 A1* | 3/2020 | Kim | H01L 25/167 |

FOREIGN PATENT DOCUMENTS

| | | |
|---|---|---|
| KR | 20060126318 | 12/2006 |
| KR | 20080012494 | 2/2008 |
| KR | 20110118664 | 10/2011 |
| KR | 101188747 | 10/2012 |

OTHER PUBLICATIONS

European Patent Office Application Serial No. 17921419.2, Search Report dated Apr. 1, 2021, 6 pages.

\* cited by examiner

[Figure 1]
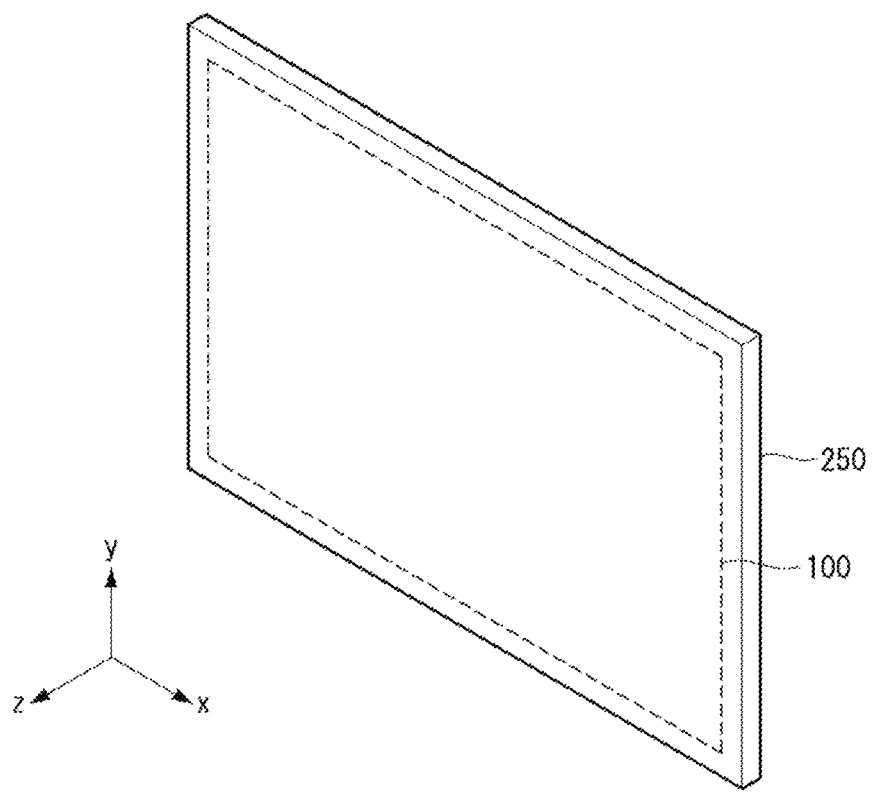

[Figure 2]
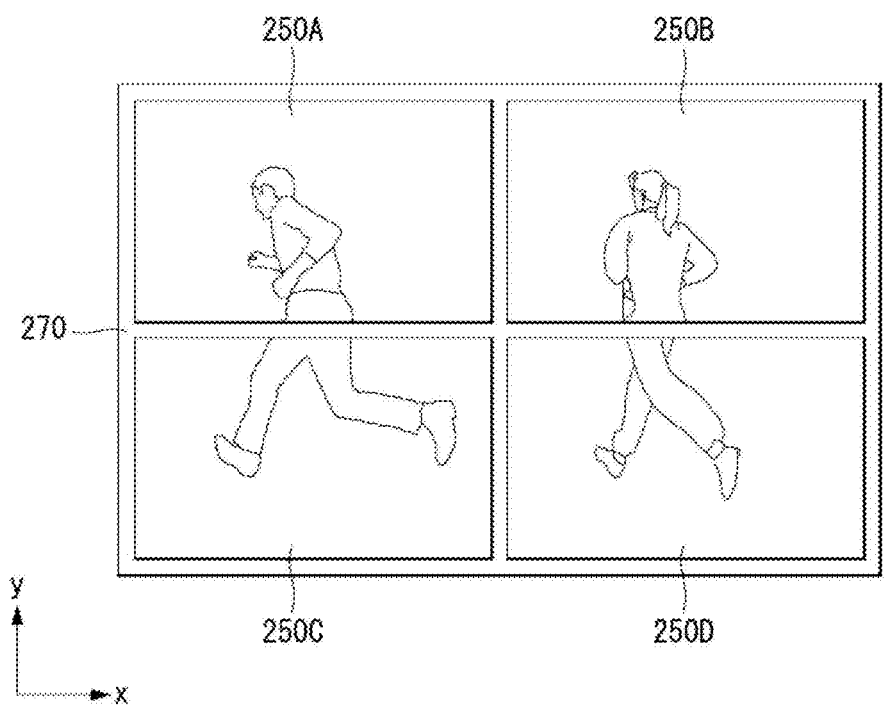

[Figure 3]
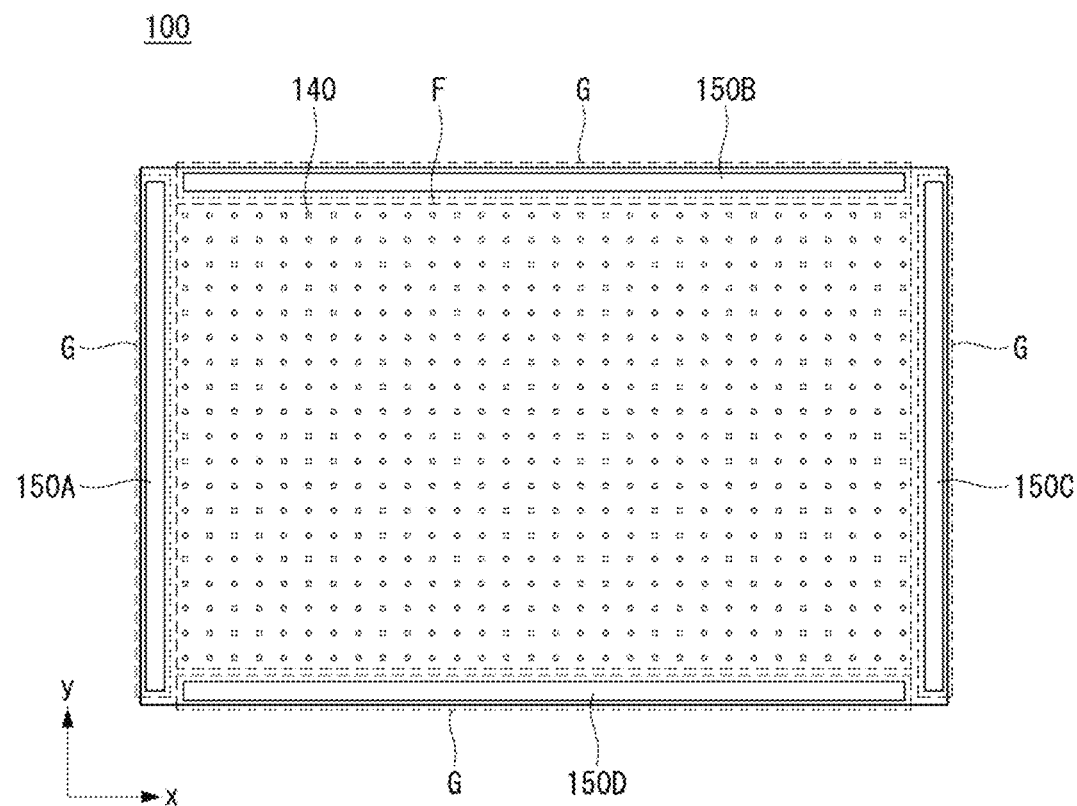

[Figure 4]
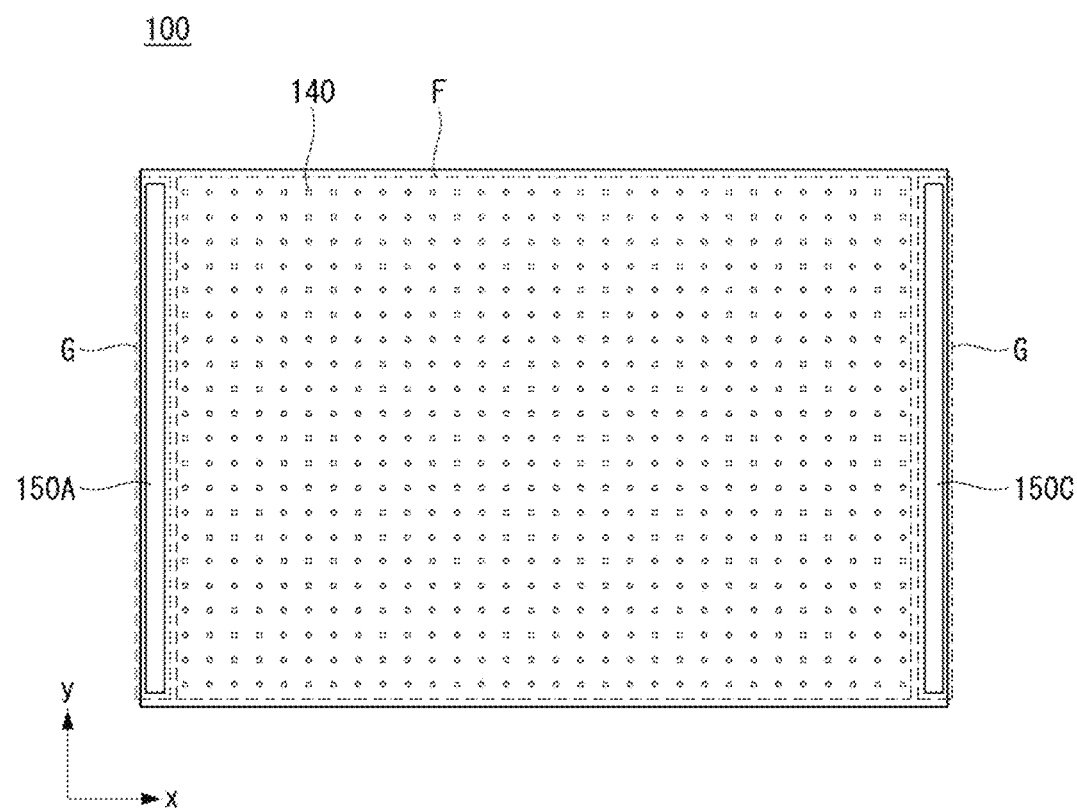

[Figure 5]
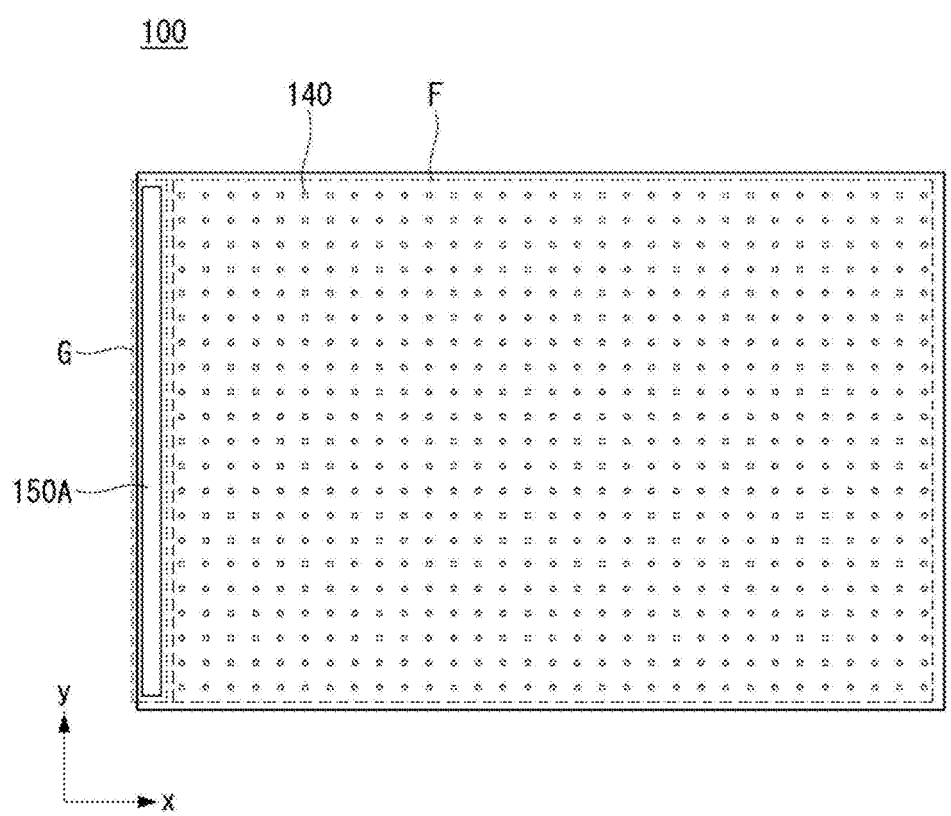

[Figure 6]
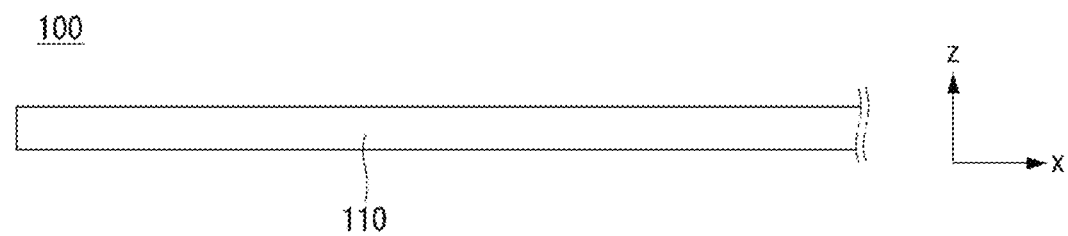

[Figure 7]
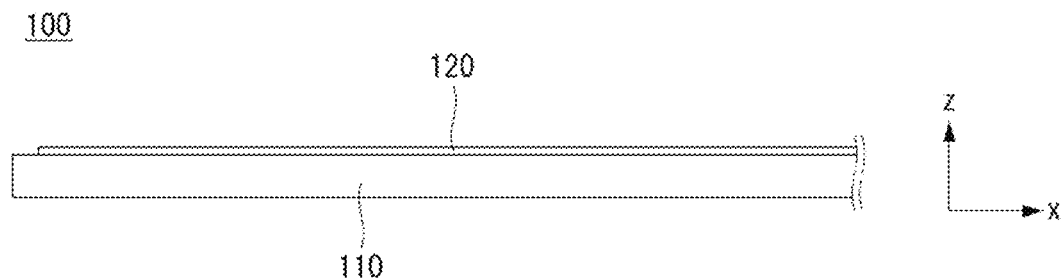

[Figure 8]
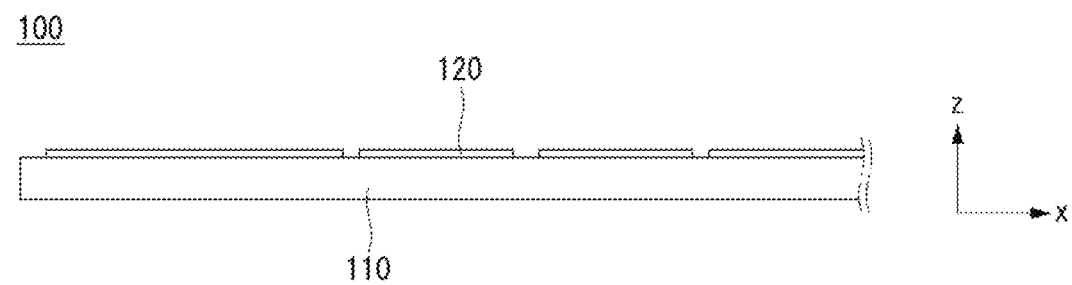

[Figure 9]
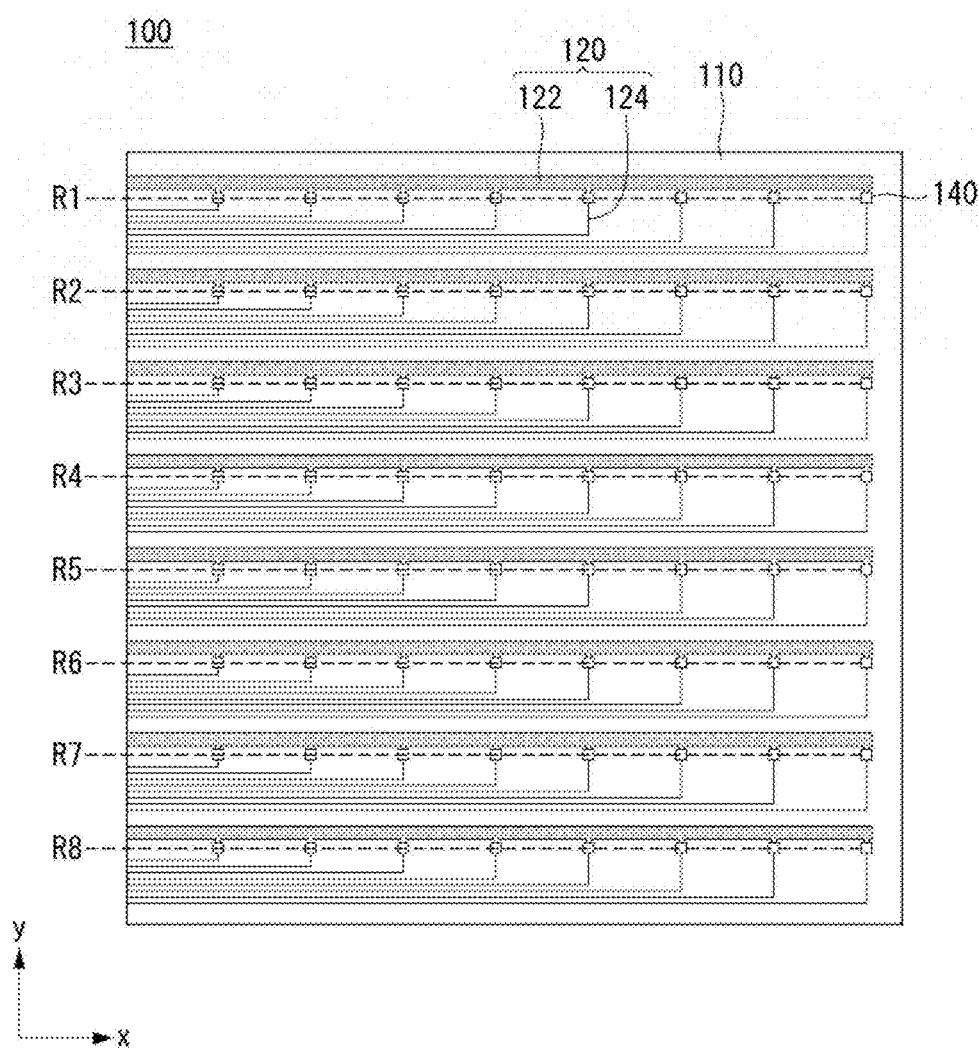

[Figure 10]
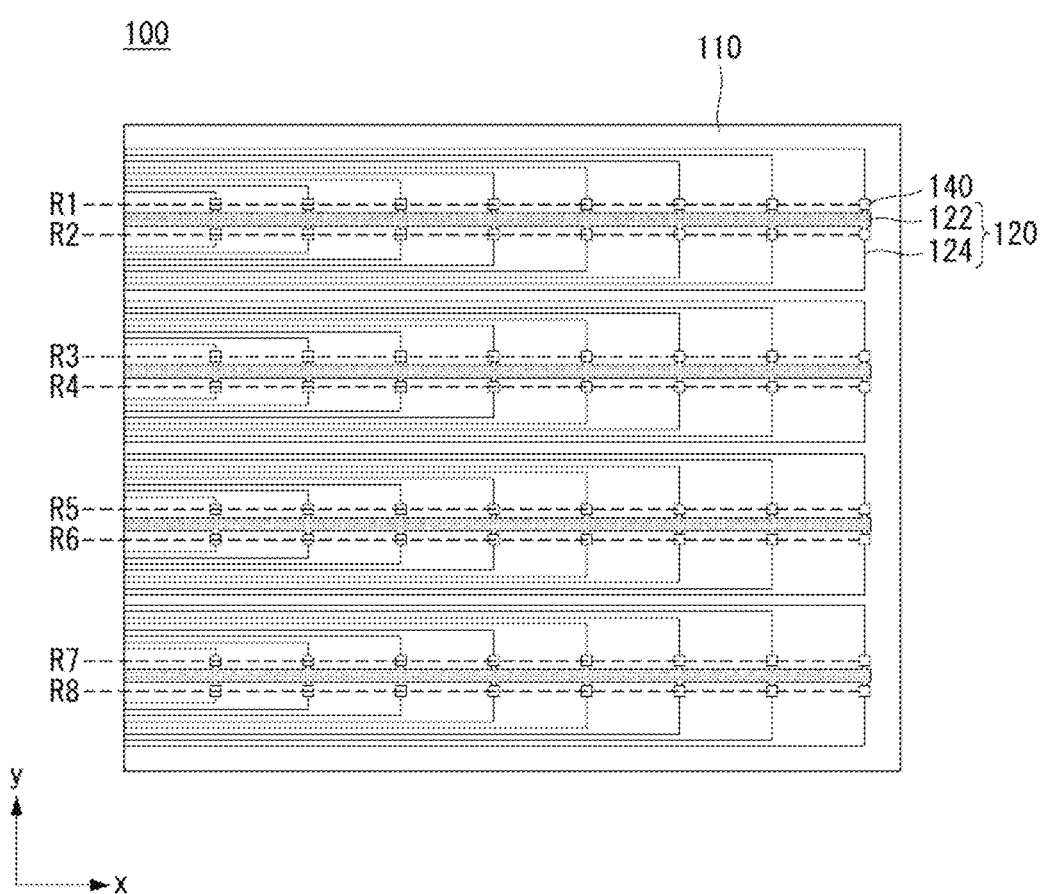

[Figure 11]
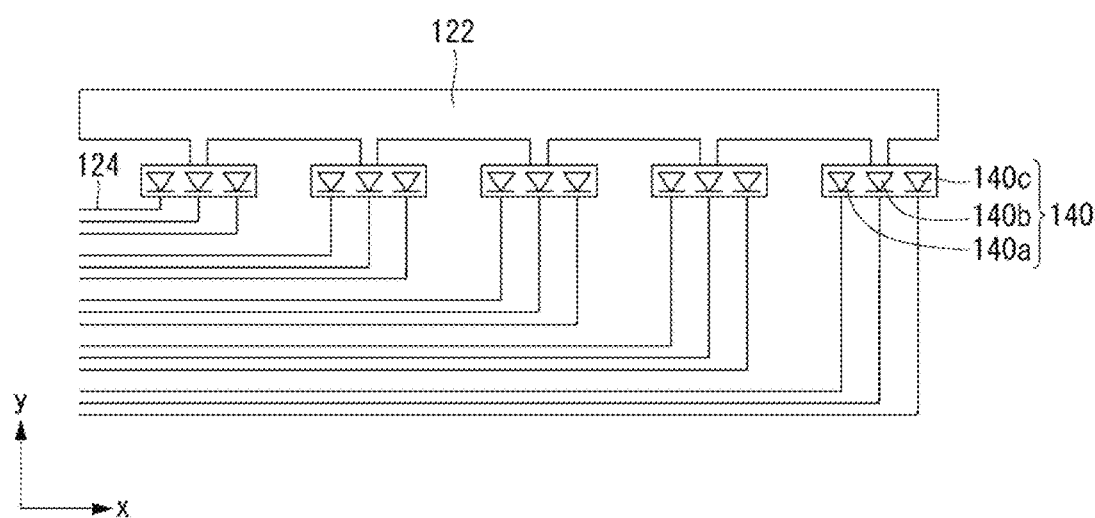

[Figure 12]
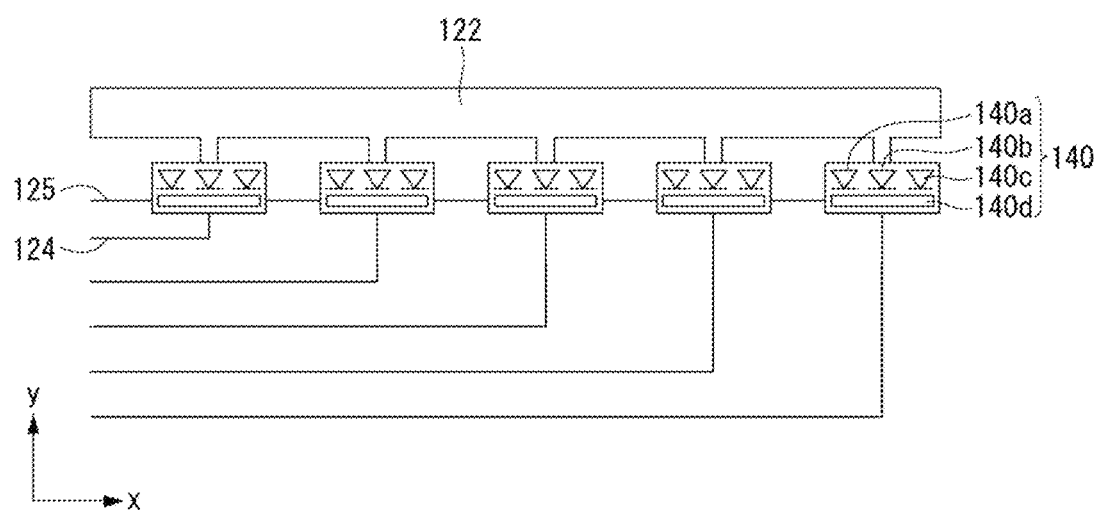

[Figure 13]
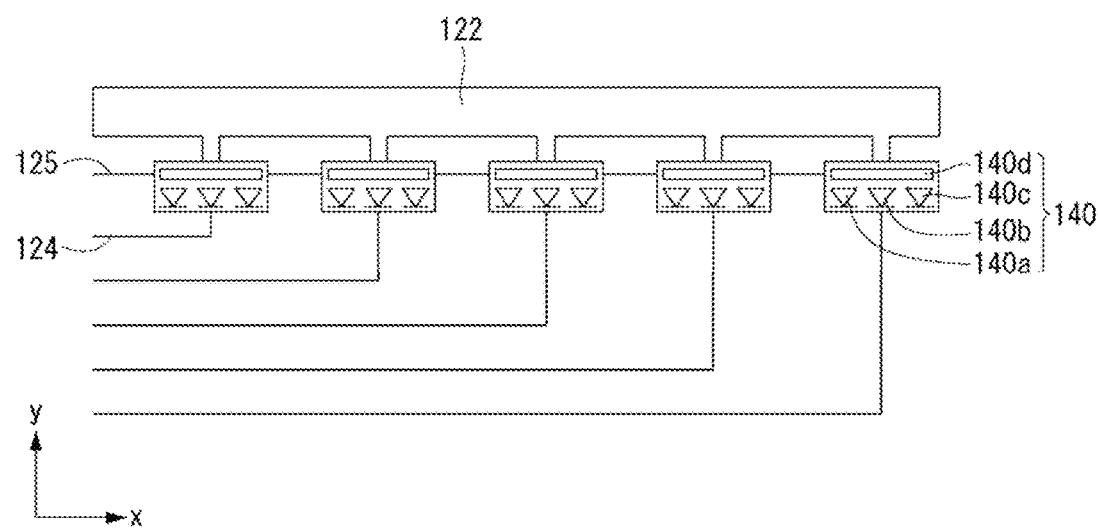

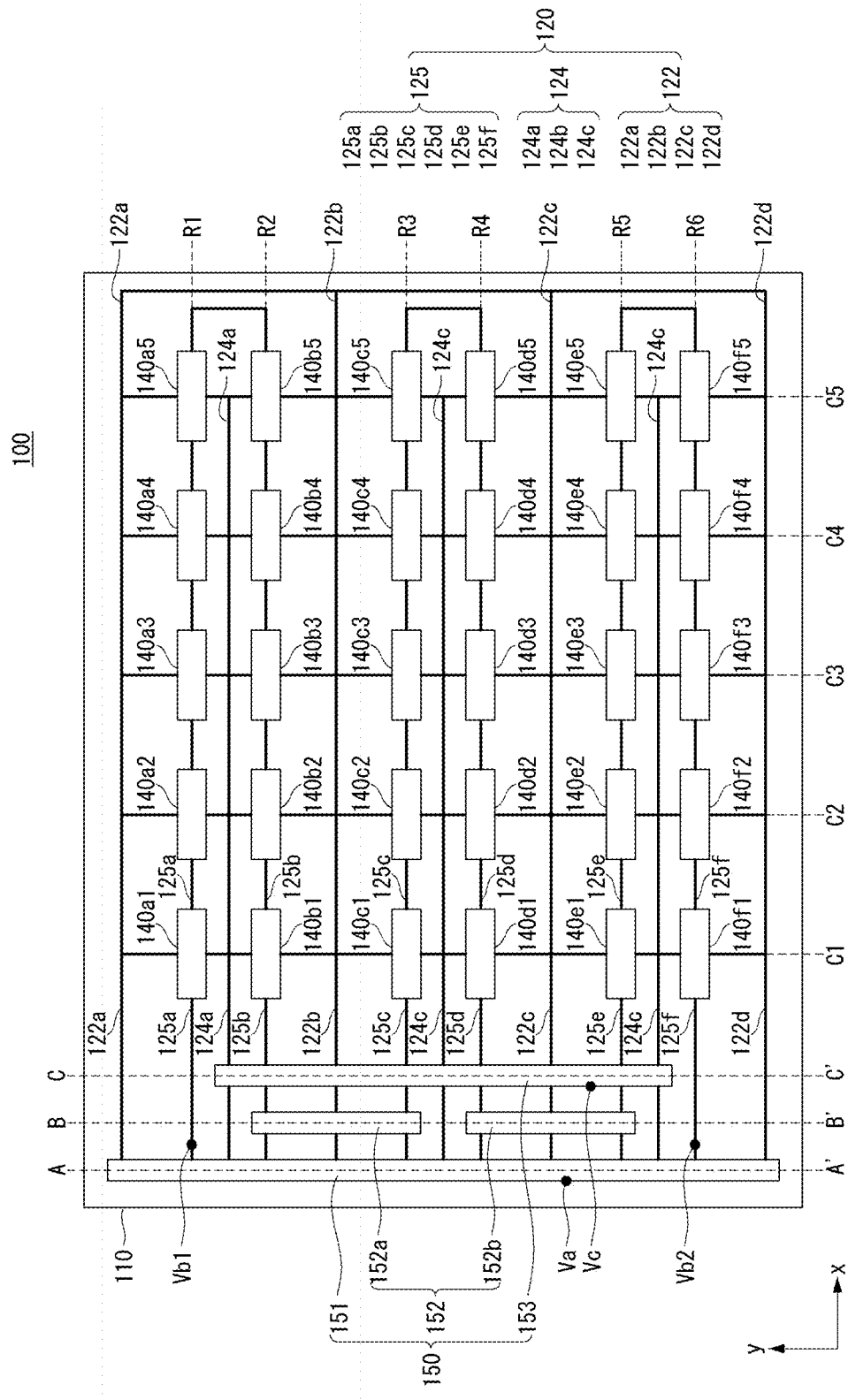
[Figure 14]

[Figure 15]
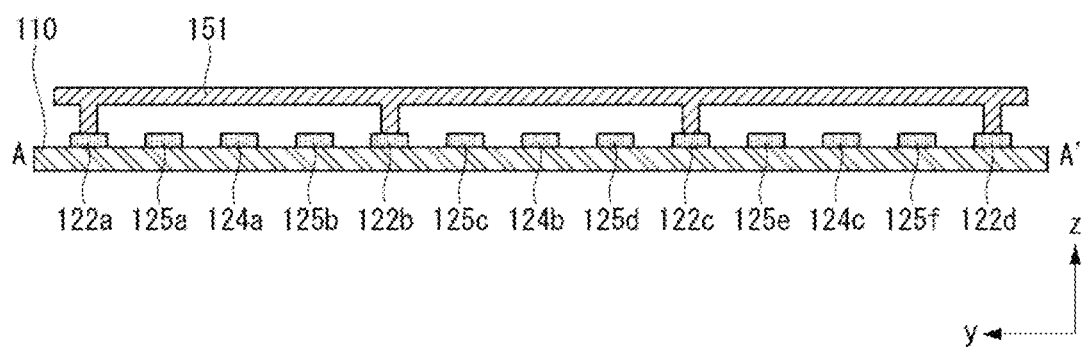

[Figure 16]
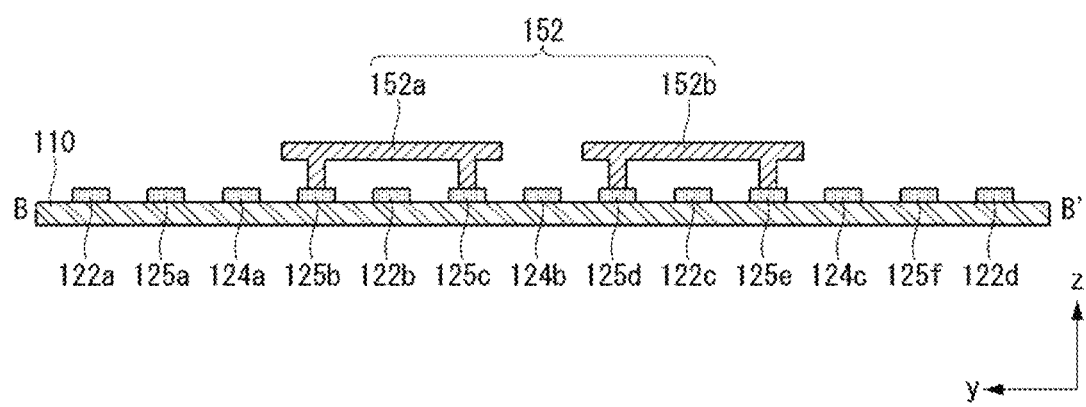

[Figure 17]
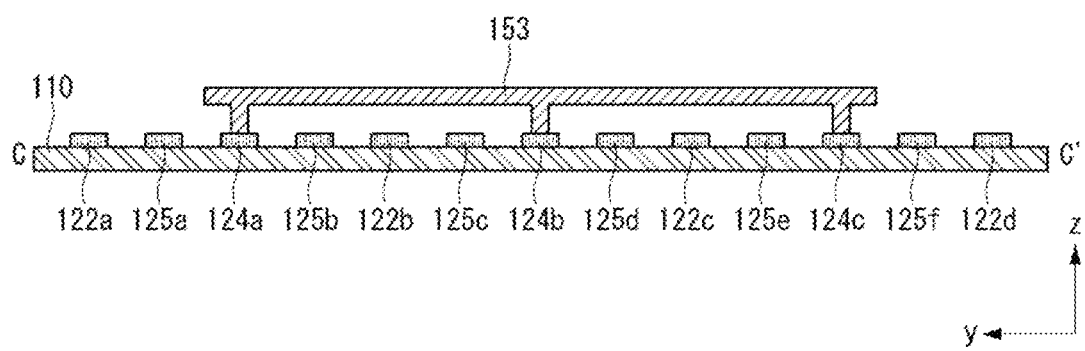

[Figure 18]
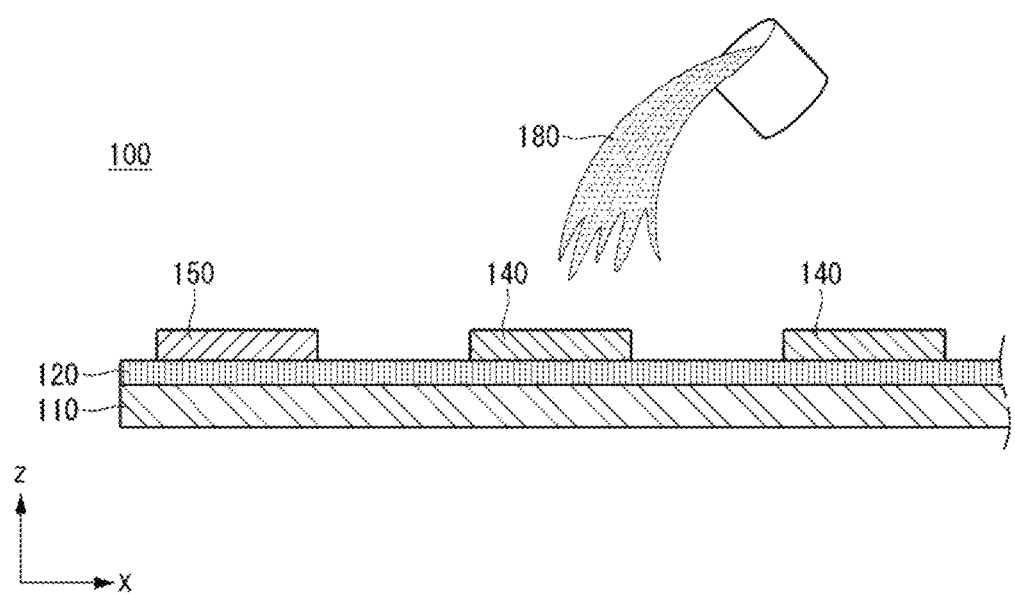

[Figure 19]
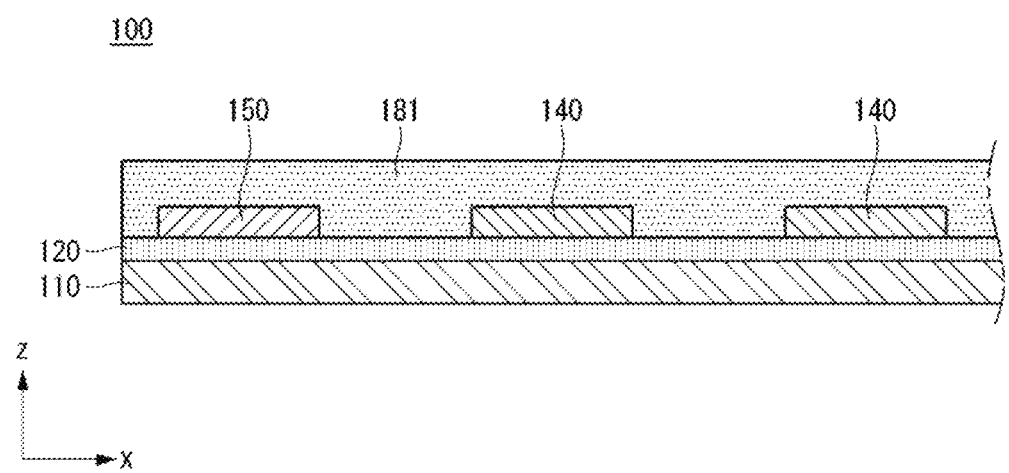

[Figure 20]
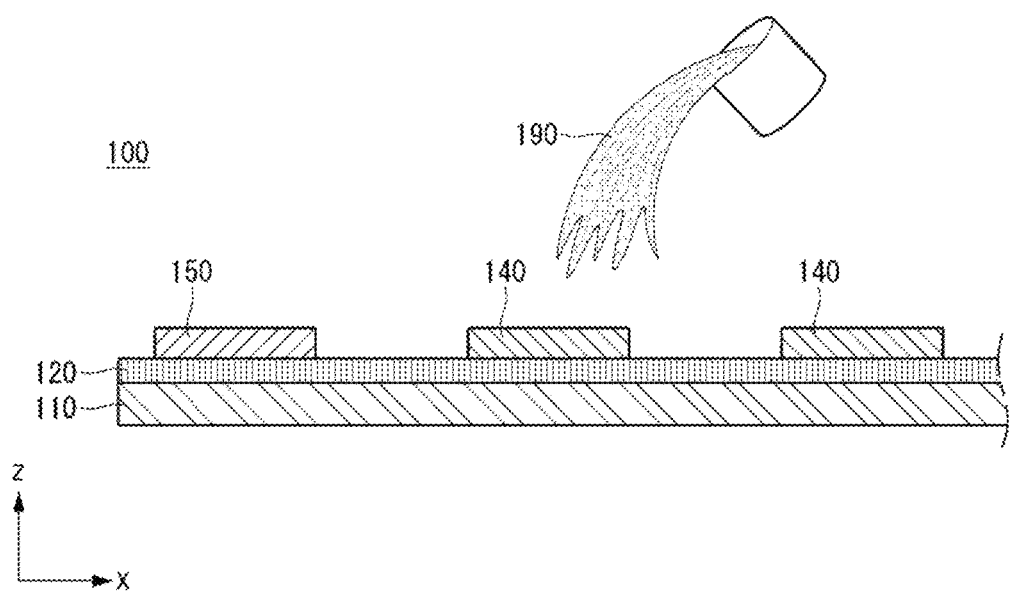

[Figure 21]
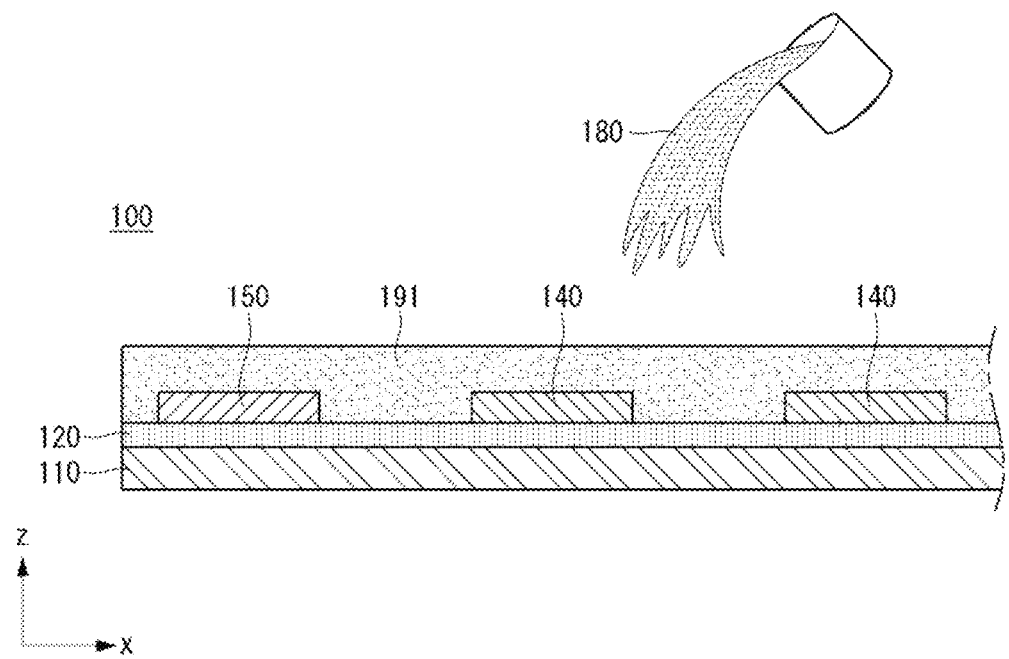

[Figure 22]
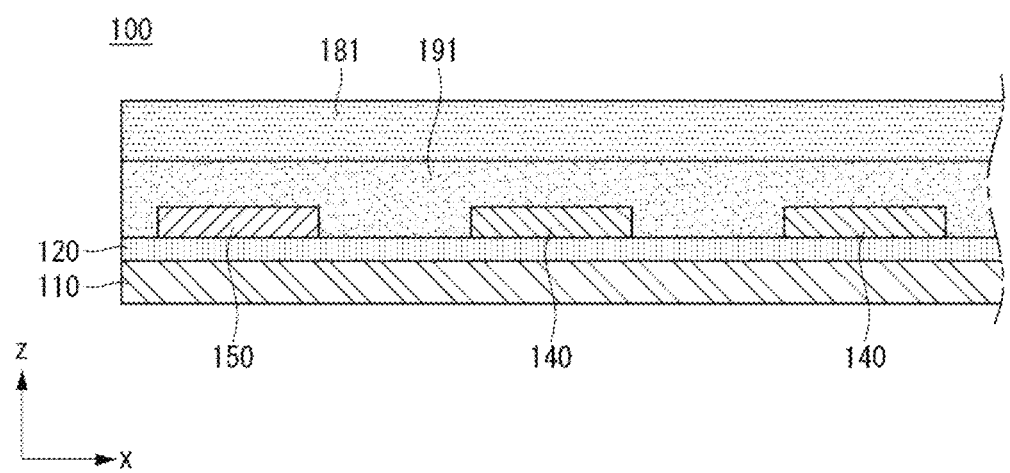

[Figure 23]
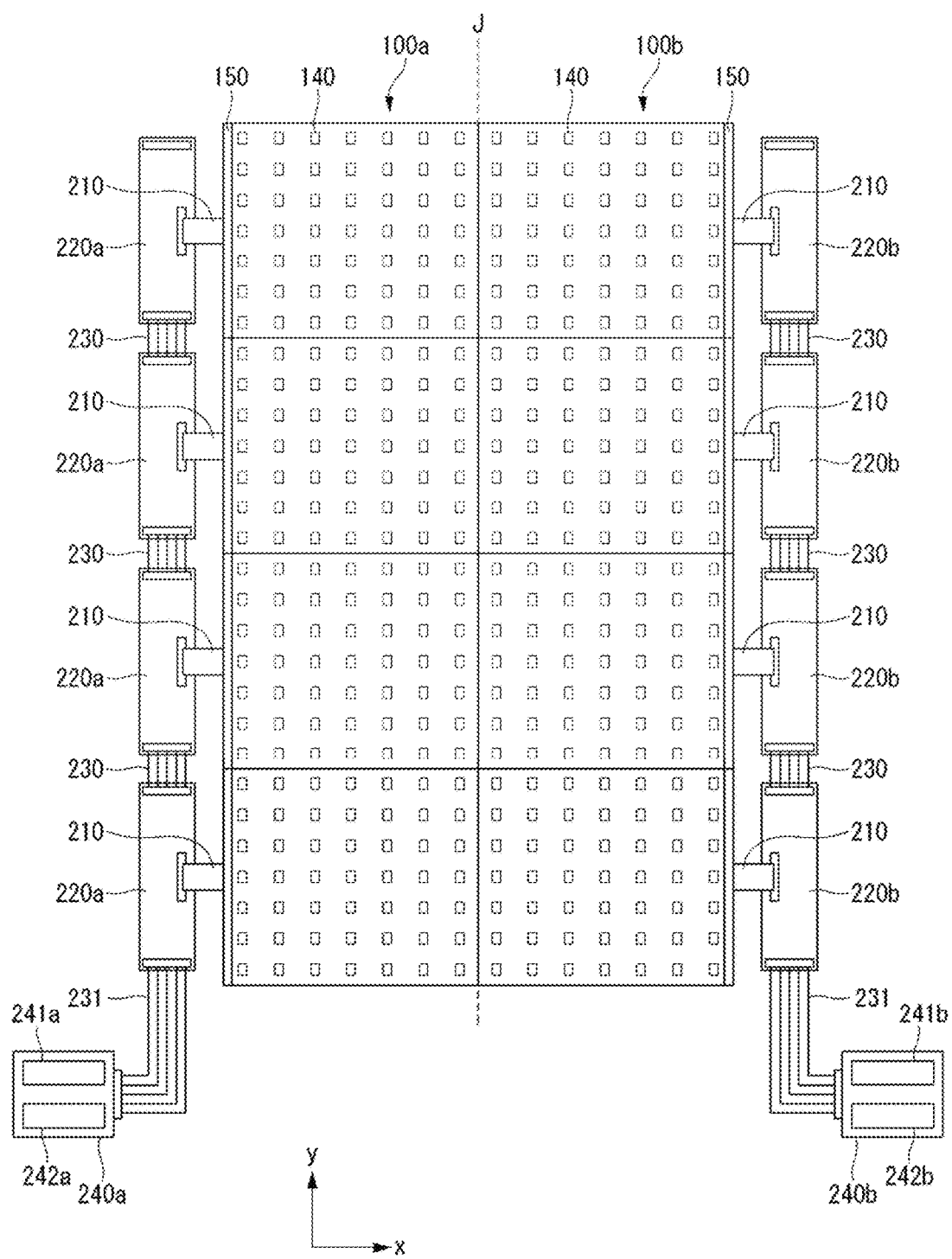

[Figure 24]
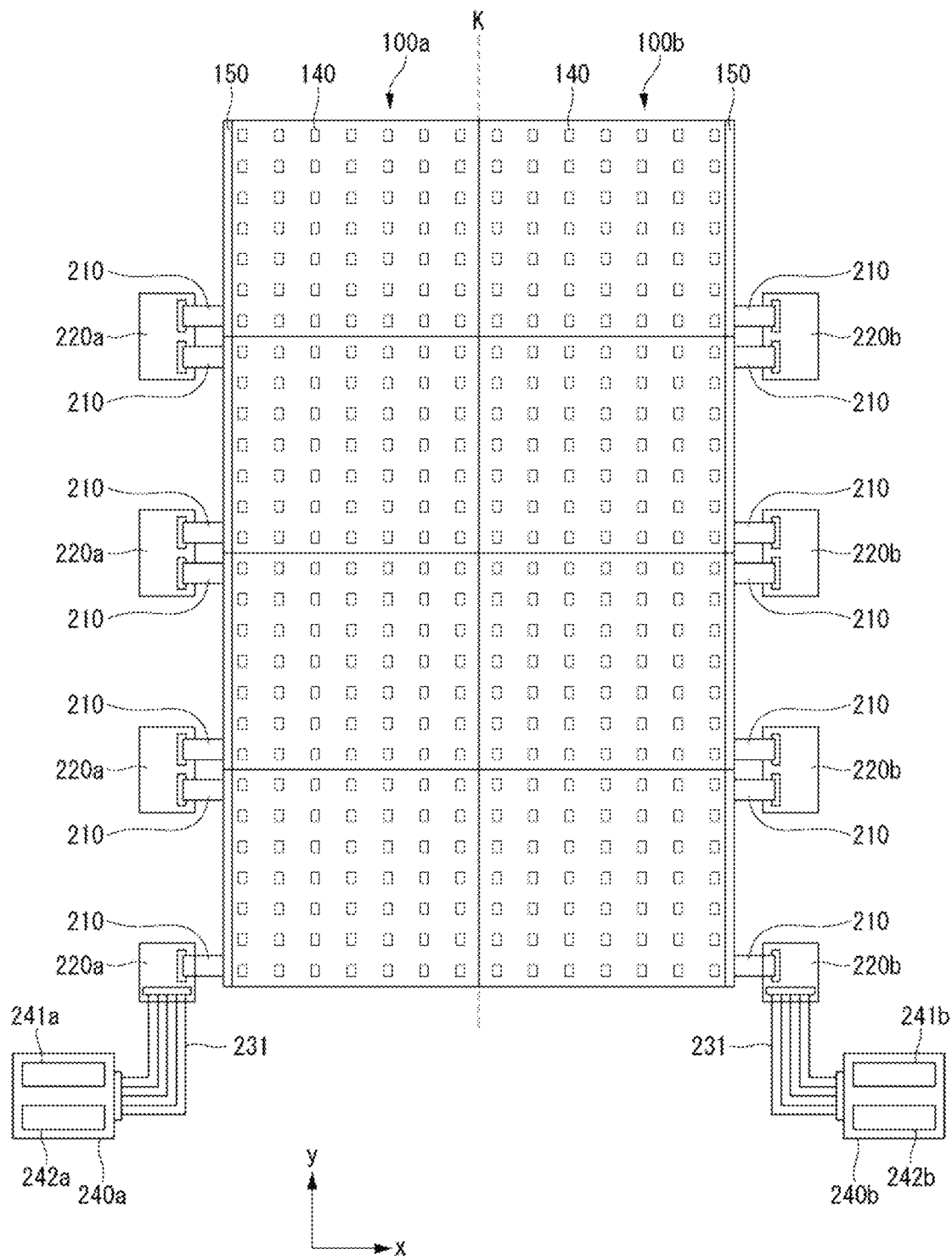

DISPLAY DEVICE

CROSS-REFERENCE TO RELATED APPLICATIONS

This application is the National Stage filing under 35 U.S.C. 371 of International Application No. PCT/KR2017/015113, filed on Dec. 20, 2017, which claims the benefit of earlier filing date and right of priority to Korean Application No. 10-2017-0100418, filed on Aug. 8, 2017, the contents of which are all hereby incorporated by reference herein in their entirety.

TECHNICAL FIELD

The present disclosure relates to a display device.

BACKGROUND ART

Digital signage is a communication tool which may be used for marketing, advertising or training by an advertiser and which may induce customer experiences, and is a digital image device which provides advertising content intended by an advertiser in addition to broadcasting content at a public place, such as an airport, hotel or hospital. Digital signage has a processor and memory embedded therein, and may be used in department stores, subways and bus stops for various usages, such as for public relations, customer services and guidance media because it can be freely moved and can clearly represent various types of content. Furthermore, only advertising content is not necessarily provided, but various types of content having other purposes in addition to advertising can be provided through digital signage.

In general, a plurality of LEDs is used in digital signage. The LED substitutes a conventional fluorescent lamp and incandescent lamp because it has long lifespan and high emission efficiency. Furthermore, the LED has been in the spotlight as a lighting device because it has a small size compared to a conventional light source.

DISCLOSURE

Technical Problem

The disclosure may provide a display device having a reduced bezel area.

The disclosure may provide a display device in which power is smoothly supplied to a plurality of light source assemblies.

The disclosure may provide a display device in which a control signal is smoothly provided to a plurality of light source assemblies.

The disclosure may provide a display device in which a plurality of positive electrodes electrically connected to a plurality of light source assemblies is connected to form an electrical node.

The disclosure may provide a display device in which a plurality of negative electrodes electrically connected to a plurality of light source assemblies is connected to form an electrical node.

The disclosure may provide a display device extended by connecting a plurality of display devices.

Technical Solution

A display device according to an embodiment of the disclosure may include a light-transmissive substrate including one surface, a first positive electrode formed on the one surface and lengthily elongated, a first negative electrode formed on the one surface and opposite the first positive electrode, a second negative electrode formed on the one surface, opposite the first positive electrode, and positioned between the first positive electrode and the first negative electrode, a second positive electrode formed on the one surface, opposite the second negative electrode, and positioned between the second negative electrode and the first negative electrode, first light sources mounted on the one surface and positioned between the first positive electrode and the second negative electrode, second light sources mounted on the one surface and positioned between the second negative electrode and the second positive electrode, third light sources mounted on the one surface and positioned between the second positive electrode and the first negative electrode, a first connector spaced apart from the one surface, facing the one surface, and connecting the first positive electrode and the second positive electrode, and a second connector spaced apart from the one surface, facing the one surface, and connecting the first negative electrode and the second negative electrode.

The first connector and the second connector may be positioned on one side of the first light sources, the second light sources, and the third light sources.

The first positive electrode and the second positive electrode may be interconnected on the other side of the first light sources, the second light sources, and the third light sources.

The display device may further include a third positive electrode formed on the one surface, opposite the first negative electrode, and positioning the first negative electrode between the third positive electrode and the second positive electrode, fourth light sources mounted on the one surface and positioned between the first negative electrode and the third positive electrode, a first switching electrode formed on the one surface to serially connect the first light sources, a second switching electrode formed on the one surface to serially connect the second light sources, a third switching electrode formed on the one surface to serially connect the third light sources, a fourth switching electrode formed on the one surface to serially connect the fourth light sources, and a third connector spaced apart from the one surface, facing the one surface, and connecting the second switching electrode and the third switching electrode.

The first switching electrode and the second switching electrode may be connected on the other side of the first light sources, the second light sources, the third light sources, and the fourth light sources. The third switching electrode and the fourth switching electrode may be connected on the other side of the first light sources, the second light sources, the third light sources, and the fourth light sources.

The first connector may be connected to the third positive electrode, and the first positive electrode, the second positive electrode, and the third positive electrode may be connected on the other side of the first light sources, the second light sources, the third light sources, and the fourth light sources.

The display device may further include a fourth positive electrode formed on the one surface, opposite the third positive electrode, and positioning the third positive electrode between the fourth positive electrode and the first negative electrode, a third negative electrode formed on the one surface, opposite the fourth positive electrode, and positioned between the third positive electrode and the fourth positive electrode, fifth light sources mounted on the one surface and positioned between the third positive electrode and the third negative electrode, sixth light sources mounted on the one side and positioned between the third negative electrode and the fourth positive electrode, a fifth switching electrode formed on the one side to serially connect the fifth light sources, a sixth switching electrode formed on the one side to serially connect the sixth light sources, and a fourth connector spaced apart from the one side, facing the one side, and connecting the fourth switching electrode and the fifth switching electrode. The fifth switching electrode and the sixth switching electrode may be connected on the other side of the first light sources, the second light sources, the third light sources, the fourth light sources, the fifth light sources, and the sixth light sources.

The fourth connector may be spaced in a length direction of the third connector.

The display device may further include a power source device, a first cable connecting the power source device and the first connector, and a second cable connecting the power source device and the second connector.

The display device may further include a first resin layer formed on the substrate. The first connector and the second connector may be positioned within the first resin layer.

The display device may further include a second resin layer formed on the substrate, and a first resin layer formed on the second resin layer. The first connector and the second connector may be positioned within the second resin layer.

Advantageous Effects

According to at least one of embodiments of the disclosure, the bezel area of the display device can be reduced.

According to at least one of embodiments of the disclosure, power can be smoothly supplied to a plurality of light source assemblies.

According to at least one of embodiments of the disclosure, a control signal can be smoothly provided to a plurality of light source assemblies.

According to at least one of embodiments of the disclosure, an electrical node can be formed by connecting a plurality of positive electrodes electrically connected to a plurality of light source assemblies.

According to at least one of embodiments of the disclosure, an electrical node can be formed by connecting a plurality of negative electrodes electrically connected to a plurality of light source assemblies.

According to at least one of embodiments of the disclosure, a display device extended by connecting a plurality of display devices can be implemented.

An additional scope of the applicability of the disclosure will become evident from the following detailed description. However, various changes and modifications may be evidently understood by those skilled in the art within the spirit and scope of the disclosure. Accordingly, it is to be understood that the detailed description and a specific embodiment, such as a specific embodiment of the disclosure, are merely given as examples.

DESCRIPTION OF DRAWINGS

FIGS. 1 to 5 are diagrams illustrating a display device according to an embodiment of the disclosure.

FIGS. 6 to 22 are diagrams illustrating the configuration a display device according to an embodiment of the disclosure.

FIG. 23 is a diagram illustrating a display device according to another embodiment of the disclosure.

FIG. 24 is a diagram illustrating a display device according to yet another embodiment of the disclosure.

MODE FOR INVENTION

Hereinafter, embodiments disclosed in the disclosure are described in detail with reference to the accompanying drawings. The same or similar element is assigned the same reference numeral regardless of its reference numeral, and a redundant description thereof is omitted. It is to be noted that the suffixes of elements used in the following description, such as a "module" and a "unit", are assigned or interchangeable with each other by taking into consideration only the ease of writing this specification, but in themselves are not particularly given distinct meanings and roles.

Furthermore, in describing the elements of the embodiments of the disclosure, terms, such as the first, the second, A, B, (a), and (b), may be used. However, although the terms are used only to distinguish one element from the other element, the essence, order, or sequence of the elements is not limited by the terms.

Furthermore, when it is said that one element is "connected", "combined", or "coupled" to the other element, the one element may be directly connected or coupled" to the other element, but it should also be understood that a third element may be "connected", "combined", or "coupled" between the two elements.

Furthermore, in describing the embodiments of the disclosure, a detailed description of a related known technology will be omitted if it is deemed to make the gist of the disclosure unnecessarily vague. Furthermore, the accompanying drawings are merely intended to make easily understood the exemplary embodiments disclosed in the disclosure, and the technical spirit disclosed in the disclosure is not restricted by the accompanying drawings and includes all modifications, equivalents, and substitutions which fall within the spirit and technological scope of the disclosure.

Hereinafter, a +x axis direction may be called a right direction. A −x axis direction may be called a left direction. A +y axis direction may be called an upper direction. A −y axis direction may be called a lower direction. A +z axis direction may be called a front direction or the front. A -z axis direction may be called a rear direction or the rear.

Referring to FIG. 1, the display device 100 may be attached to an attachment surface 250. The attachment surface 250 may be a transparent material. For example, the attachment surface 250 may be a glass window. The display device 100 may be a transparent material. For example, the display device 100 may include a transparent resin layer. Although the display device 100 is attached to the attachment surface 250, the display device 100 and the attachment surface 250 can transmit light.

The display device 100 may display a screen. The display device 100 may forward emit light. Alternatively, the display device 100 may emit light in the +z axis direction. Light emitted from the display device 100 may pass through the attachment surface 250 and forward travel. Alternatively, light emitted from the display device 100 may pass through the attachment surface 250 and travel in the +z axis direction.

Referring to FIG. 2, attachment surfaces 250A, 250B, 250C, and 250D may be fixed to a frame 270. The plurality of attachment surfaces 250A, 250B, 250C, and 250D may be fixed to the frame 270. A plurality of display devices may be attached to the attachment surfaces 250A, 250B, 250C, and 250D, respectively. The plurality of display devices may display a screen while operating in conjunction with each other. For example, the plurality of display devices may divide a single screen and display the divided screens. Each of the display devices may display a part of the single screen.

Referring to FIG. 3, the display device 100 may have a rectangular shape. A plurality of light source assemblies 140 may be arranged in the display device 100. Connectors 150A, 150B, 150C, and 150D may be mounted along the circumference of the display device 100. That is, the connectors 150A, 150B, 150C, and 150D may be arranged on the four sides of the display device 100. The connectors 150A, 150B, 150C, and 150D may surround the plurality of light source assemblies 140.

The plurality of light source assemblies 140 may be electrically connected to the display device 100. The connectors 150A, 150B, 150C, and 150D may be electrically connected to the display device 100. The connectors 150A, 150B, 150C, and 150D may be connected to the plurality of light source assemblies 140 through the display device 100. The connectors 150A, 150B, 150C, and 150D may transmit, to the light source assemblies 140, power supplied from a power source device. Furthermore, the light source assemblies 140 may receive a control signal, transmitted by a control device, through the connectors 150A, 150B, 150C, and 150D.

In the display device 100, an area in which the plurality of light source assemblies 140 is mounted may be called a display area F. In the display device 100, an area in which the connectors 150A, 150B, 150C, and 150D are mounted may be called a bezel area G. The connectors 150A, 150B, 150C, and 150D may be arranged on the four sides of the display device 100 in order to smoothly transmit power and a control signal to the plurality of light source assemblies 140. The ratio of the bezel area G may be increased and the ratio of the display area F may be reduced because the connectors 150A, 150B, 150C, and 150D are arranged on the four sides of the display device 100.

Referring to FIG. 4, the connectors 150A and 150C may be arranged along one side of the display device 100 and the other side parallel to the one side. Alternatively, the connectors 150A and 150C may include a left connector 150A and a right connector 150C. The left connector 150A and the right connector 150C may be arranged to face each other.

The plurality of light source assemblies 140 may be positioned between the left connector 150A and the right connector 150C. The display area F may be positioned between the left connector 150A and the right connector 150C. Alternatively, the display area F may be positioned between the bezel areas G.

Compared to the case of FIG. 3, the ratio of the bezel area G can be reduced and the ratio of the display area F can be increased. Accordingly, it may be advantageous to display a large screen compared to the area of the display device 100.

Referring to FIG. 5, the connector 150A may be arranged along one side of the display device 100. The light source assemblies 140 may be arranged in an area in which the connector 150A is not positioned. The connector 150A positioned on one side of the display device 100 may supply power to all of the light source assemblies 140. Furthermore, the connector 150A positioned on one side of the display device 100 may transmit a control signal to all of the light source assemblies 140.

Compared to the cases of FIGS. 3 and 4, the ratio of the bezel area G can be reduced and the ratio of the display area F can be increased. Accordingly, it may be advantageous to display a large screen compared to the area of the display device 100.

However, in order to supply power and transmit a control signal to the light source assemblies 140 through the relatively reduced connector 150A, an efficient structure of the connector 150A or an efficient wiring structure of the display device 100 may be necessary.

Referring to FIG. 6, the display device 100 may include a base 110. The base 110 may be referred to as a substrate. Alternatively, the base 110 may be referred to as a plate. The base 110 may be a transparent material. Alternatively, the base 110 may have light transparency. The thickness of the base 110 may be very thin. For example, the thickness of the base 110 may be 250 µm, for example.

The base 110 may have an insulating property. Power supplied to the display device 100 may be blocked without passing through the base 110.

In a process of producing the display device 100, heat may be applied to the base 110. For example, the base 110 may include a polyethylene terephthalate (PET) material. If the thickness of the base 110 is sufficiently thick, the base 110 may not be thermally deformed although heat of 200° or more is applied to the base 110 in a process of producing the display device 100.

Referring to FIG. 7, an electrode layer 120 may be formed on the base 110. The electrode layer 120 may have conductivity. The electrode layer 120 may function as a passage for transmitting power supplied from a power source device. Furthermore, the electrode layer 120 may function as a passage for transmitting a control signal transmitted by the control device.

The electrode layer 120 may be coated on the base 110. Furthermore, the electrode layer 120 may be coated on the base 110 in a very thin thickness. The electrode layer 120 may have light transparency due to a thin thickness. Accordingly, although the electrode layer 120 is coated on the base 110, the display device 100 can have light transparency.

The electrode layer 120 may include a metal nanowire. For example, the electrode layer 120 may include an Ag nanowire. The Ag nanowire has high conductivity and may have excellent light transparency.

Referring to FIG. 8, the electrode layer 120 may form a pattern. The pattern of the electrode layer 120 may function as a wiring structure.

The pattern of the electrode layer 120 may be formed through an additional process after the electrode layer 120 is coated on the base 110. For example, the pattern of the electrode layer 120 may be formed by radiating a laser to the electrode layer 120 coated on the base 110. Alternatively, the pattern of the electrode layer 120 may be formed by etching the electrode layer 120 coated on the base 110.

Referring to FIG. 9, the display device 100 may include the light source assembly 140. The light source assembly 140 may be mounted on the base 110. Furthermore, the light source assembly 140 may be electrically connected to the electrode layer 120.

The electrode layer 120 may include a positive electrode 122 and a negative electrode 124. The positive electrode 122 may be called a positive pole, an oxidization electrode or an anode. The negative electrode 124 may be called a negative pole, a reduction electrode or a cathode.

The light source assembly 140 may be mounted in plural number. The plurality of light source assemblies 140 may be arranged along one side of the base 110, and may form one row. The row may be referred to as a "row." A plurality of the light source assemblies 140 forming a single row may be separated from one another. Alternatively, a plurality of the light source assemblies 140 formed a single row may be arranged at equal intervals.

Rows R1, R2, R3, R4, R5, and R6 formed by the plurality of light source assemblies 140 may be formed in plural number. Each of the rows R1, R2, R3, R4, R5, and R6 may be arranged along one side of the base 110. Furthermore, the rows R1, R2, R3, R4, R5, and R6 may be separated from one another. Alternatively, the rows R1, R2, R3, R4, R5, and R6 may be arranged at equal intervals.

The positive electrode 122 may be lengthily elongated along one row. The positive electrode 122 may be electrically connected to a plurality of the light source assemblies 140 of one row. The positive electrode 122 may be positioned on the upper side of one row.

The negative electrode 124 may be lengthily elongated along one row. The negative electrode 124 may be electrically connected to a plurality of the light source assemblies 140 of one row. The negative electrode 124 may be positioned on the lower side of one row. That is, one row may be positioned between the positive electrode 122 and the negative electrode 124.

The positive electrode 122 connected to one row may be configured with one electrode. A plurality of the light source assemblies 140 of one row may be connected to one positive electrode 122. The negative electrode 124 connected to one row may be formed in plural number. The negative electrodes 124 may be formed in accordance with a plurality of the light source assemblies 140 of one row.

Referring to FIG. 10, the positive electrode 122 may be positioned between the first row R1 and the second row R2. Alternatively, the positive electrode 122 may be positioned between the third row R3 and the fourth row R4. Alternatively, the positive electrode 122 may be positioned between the fifth row R5 and the sixth row R6. Alternatively, the positive electrode 122 may be positioned between the seventh row R7 and the eighth row R8.

A plurality of the light source assemblies 140 of the first row R1 may be electrically connected to one positive electrode 122 positioned between the first row R1 and the second row R2. A plurality of the light source assemblies 140 of the second row R2 may be electrically connected to one positive electrode 122 positioned between the first row R1 and the second row R2.

The negative electrode 124 electrically connected to the first row R1 may be arranged on the upper side of the first row R1. The negative electrodes 124 may be formed to correspond to the plurality of light source assemblies 140 of the first row R1, respectively.

The negative electrodes 124 electrically connected to the second row R2 may be arranged on the lower side of the second row R2. The negative electrodes 124 may be formed to correspond to the plurality of light source assemblies 140 of the second row R2, respectively.

The connection structure of the positive electrode 122 electrically connected to the third row R3, the negative electrodes 124 electrically connected to the third row R3, the positive electrode 122 electrically connected to the fourth row R4, and the negative electrodes 124 electrically connected to the fourth row R4 may be the same as the aforementioned connection structure of the first row R1, the second row R2, the positive electrodes 122, and the negative electrodes 124.

The connection structure of the fifth row R5 and the sixth row R6 and the connection structure of the seventh row R7 and the eighth row R8 may also be the same as the connection structure of the first row R1 and the second row R2.

Referring to FIG. 11, the light source assembly 140 may include a plurality of LED chips 140a, 140b, and 140c. For example, the light source assembly 140 may include a red LED chip 140a, a green LED chip 140b, and a blue LED chip 140c.

A plurality of the light source assemblies 140 may be electrically connected to one positive electrode 122. The negative electrodes 124 connected to the respective light source assemblies 140 may be independent. Furthermore, the negative electrode 124 electrically connected to each assembly may include three electrodes. The three electrodes may be electrically connected to the red LED chip 140a, the green LED chip 140b, and the blue LED chip 140c, respectively. Accordingly, the LED chips 140a, 140b, and 140c of the light source assembly 140 may be individually controlled.

Referring to FIGS. 12 and 13, the light source assembly 140 may include the plurality of LED chips 140a, 140b, and 140c and an IC chip 140d. The electrode layer 120 may include the positive electrode 122, the negative electrode 124 and a control electrode 125. The positive electrode 122 may be called an electrode. Alternatively, the negative electrode 124 may be called an electrode. Alternatively, the control electrode 125 may be called an electrode. Alternatively, the control electrode 125 may be referred to as a switching electrode.

The control electrode 125 may electrically connect adjacent light source assemblies 140. Furthermore, the control electrode 125 may serially connect adjacent light source assemblies 140. The control electrode 125 may transmit a signal to control the IC chip 140d of the light source assembly 140.

A plurality of the light source assemblies 140 may be electrically connected to one positive electrode 122. The negative electrodes 124 connected to the respective light source assemblies 140 may be independent. Furthermore, the negative electrode 124 electrically connected to the light source assemblies 140 may be one electrode. Although the negative electrode 124 is not connected to each of a plurality of the LED chips 140a, 140b, and 140c included in the light source assembly, the plurality of LED chips 140a, 140b, and 140c can be individually controlled through the IC chip 140d.

An electric current supplied through a power source device may flow in order of the positive electrode 122, the plurality of LED chips 140a, 140b, and 140c, the IC chip 140d, and the negative electrode 124. Alternatively, an electric current supplied through the power source device may flow in order of the positive electrode 122, the IC chip 140d, the plurality of LED chips 140a, 140b, and 140c, and the negative electrode 124.

Referring to FIG. 14, the plurality of light source assemblies 140 may be arranged to form the rows R1, R2, R3, R4, R5, and R6 or columns C1, C2, C3, C4, C5, and C6. The row may be called a row, and the column may be called a column. The first row R1 may include five light source assemblies 140a1, 140a2, 140a3, 140a4, and 140a5 arranged along one side of the base 110. Alternatively, the first row R1 may include the five light source assemblies 140a1, 140a2, 140a3, 140a4, and 140a5 arranged in the x axis direction. The light source assemblies 140a1, 140a2, 140a3, 140a4, and 140a5 arranged in the first row R1 may be called first light sources 140a1, 140a2, 140a3, 140a4, and 140a5. The first light sources 140a1, 140a2, 140a3, 140a4, and 140a5 may be arranged to form a first array.

The second row R2 may include five light source assemblies 140b1, 140b2, 140b3, 140b4, and 140b5 arranged along one side of the base 110. Alternatively, the second row R2 may include the five light source assemblies 140b1, 140b2, 140b3, 140b4, and 140b5 arranged in the x axis direction. The second row R2 may be separated from the first row R1. The second row R2 may be positioned below the first row R1. The light source assemblies 140b1, 140b2, 140b3, 140b4, and 140b5 arranged in the second row R2 may be called second light sources 140b1, 140b2, 140b3, 140b4, and 140b5. The second light sources 140b1, 140b2, 140b3, 140b4, and 140b5 may be arranged to form a second array.

The third row R3 may include five light source assemblies 140c1, 140c2, 140c3, 140c4, and 140c5 arranged along one side of the base 110. Alternatively, the third row R3 may include the five light source assemblies 140c1, 140c2, 140c3, 140c4, and 140c5 arranged in the x axis direction. The third row R3 may be separated from the second row R2. The third row R3 may be positioned below the second row R2. The light source assemblies 140c1, 140c2, 140c3, 140c4, and 140c5 arranged in the third row R3 may be called third light sources 140c1, 140c2, 140c3, 140c4, and 140c5. The third light sources 140c1, 140c2, 140c3, 140c4, and 140c5 may be arranged to form a third array.

The fourth row R4 may include five light source assemblies 140d1, 140d2, 140d3, 140d4, and 140d5 arranged along one side of the base 110. Alternatively, the fourth row R4 may include the five light source assemblies 140d1, 140d2, 140d3, 140d4, and 140d5 arranged in the x axis direction. The fourth row R4 may be separated from the third row R3. The fourth row R4 may be positioned below the third row R3. The light source assemblies 140d1, 140d2, 140d3, 140d4, and 140d5 arranged in the fourth row R4 may be called fourth light sources 140d1, 140d2, 140d3, 140d4, and 140d5. The fourth light sources 140d1, 140d2, 140d3, 140d4, and 140d5 may be arranged to form a fourth array.

The fifth row R5 may include five light source assemblies 140e1, 140e2, 140e3, 140e4, and 140e5 arranged along one side of the base 110. Alternatively, the fifth row R5 may include the five light source assemblies 140e1, 140e2, 140e3, 140e4, and 140e5 arranged in the x axis direction. The fifth row R5 may be separated from the fourth row R4. The fifth row R5 may be positioned below the fourth row R4. The light source assemblies 140e1, 140e2, 140e3, 140e4, and 140e5 arranged in the fifth row R5 may be called fifth light sources 140e1, 140e2, 140e3, 140e4, and 140e5. The fifth light sources 140e1, 140e2, 140e3, 140e4, and 140e5 may be arranged to form a fifth array.

The sixth row R6 may include five light source assemblies 140f1, 140f2, 140f3, 140f4, and 140f5 arranged along one side of the base 110. Alternatively, the sixth row R6 may include the five light source assemblies 140f1, 140f2, 140f3, 140f4, and 140f5 arranged in the x axis direction. The sixth row R6 may be separated from the fifth row R5. The sixth row R6 may be positioned below the fifth row R5. The light source assemblies 140f1, 140f2, 140f3, 140f4, and 140f5 arranged in the sixth row R6 may be called sixth light sources 140f1, 140f2, 140f3, 140f4, and 140f5. The sixth light sources 140f1, 140f2, 140f3, 140f4, and 140f5 may be arranged to form a sixth array.

The number of rows may be greater or smaller than 6, if necessary. Furthermore, the number of light source assemblies included in each of the rows R1, R2, R3, R4, R5, and R6 may be greater or smaller than 5, if necessary.

The first column C1 may include six light source assemblies 140a1, 140b1, 140c1, 140d1, and 140f1 arranged along a direction orthogonal to the first row R1. Alternatively, the first column C1 may include the six light source assemblies 140a1, 140b1, 140c1, 140d1, and 140f1 arranged in the y axis direction.

The second column C2 may include six light source assemblies 140a2, 140b2, 140c2, 140d2, and 140f2 arranged along a direction orthogonal to the first row R1. Alternatively, the second column C2 may include the six light source assemblies 140a2, 140b2, 140c2, 140d2, and 140f2 arranged in they axis direction. The second column C2 may be separated from the first column C1. The second column C2 may be positioned on the right side of the first column C1.

The third column C3 may include six light source assemblies 140a3, 140b3, 140c3, 140d3, and 140f3 arranged along a direction orthogonal to the first row R1. Alternatively, the third column C3 may include the six light source assemblies 140a3, 140b3, 140c3, 140d3, and 140f3 arranged in the y axis direction. The third column C3 may be separated from the second column C2. The third column C3 may be positioned on the right side of the second column C2.

The fourth column C4 may include six light source assemblies 140a4, 140b4, 140c4, 140d4, and 140f4 arranged along a direction orthogonal to the first row R1. Alternatively, the fourth column C4 may include the six light source assemblies 140a4, 140b4, 140c4, 140d4, and 140f4 arranged in the y axis direction. The fourth column C4 may be separated from the third column C3. The fourth column C4 may be positioned on the right side of the third column C3.

The fifth column C5 may include six light source assemblies 140a5, 140b5, 140c5, 140d5, 140f5 arranged along a direction orthogonal to the first row R1. Alternatively, the fifth column C5 may include the six light source assemblies 140a5, 140b5, 140c5, 140d5, 140f5 arranged in they axis direction. The fifth column C5 may be separated from the fourth column C4. The fifth column C5 may be positioned on the right side of the fourth column C4.

The number of columns may be greater or smaller than 5, if necessary. Furthermore, the number of light source assemblies 140 included in each of the columns may be greater or smaller than 6, if necessary.

A first positive electrode 122a may be lengthily elongated along the first row R1. Alternatively, the first positive electrode 122a may be lengthily elongated along the x axis direction. The first positive electrode 122a may be positioned above the first row R1. The first positive electrode 122a may be electrically connected to the light source assemblies 140a1, 140a2, 140a3, 140a4, and 140a5 of the first row R1.

A second positive electrode 122b may be lengthily elongated along the second row R2. Alternatively, the second positive electrode 122b may be lengthily elongated along the x axis direction. The second positive electrode 122b may be positioned between the second row R2 and the third row R3. The second positive electrode 122b may be electrically connected to the light source assemblies 140b1, 140b2, 140b3, 140b4, and 140b5 of the second row R2. Furthermore, the second positive electrode 122b may be electrically connected to the light source assemblies 140c1, 140c2, 140c3, 140c4, and 140c5 of the third row R3.

A third positive electrode 122c may be lengthily elongated along the fourth row R4. Alternatively, the third positive electrode 122c may be lengthily elongated along the x axis direction. The third positive electrode 122c may be positioned between the fourth row R4 and the fifth row R5. The third positive electrode 122c may be electrically connected to the light source assemblies 140d1, 140d2, 140d3, 140d4, and 140d5 of the fourth row R4. Furthermore, the third positive electrode 122c may be electrically connected to the light source assemblies 140e1, 140e2, 140e3, 140e4, and 140e5 of the fifth row R5.

A fourth positive electrode 122d may be lengthily elongated along the sixth row R6. Alternatively, the fourth positive electrode 122d may be lengthily elongated along the x axis direction. The fourth positive electrode 122d may be positioned below the sixth row R6. The fourth positive electrode 122d may be electrically connected to the light source assemblies 140f1, 140f2, 140f3, 140f4, and 140f5 of the sixth row R6.

The first positive electrode 122a to the fourth positive electrode 122d may be electrically connected near the right side of the base 110. Alternatively, the first positive electrode 122a to the fourth positive electrode 122d may be electrically interconnected on the right side of the fifth column C5. The first positive electrode 122a to the fourth positive electrode 122d may form one node on the right side of the fifth column C5.

A first negative electrode 124a may be lengthily elongated along the first row R1. Alternatively, the first negative electrode 124a may be lengthily elongated along the x axis direction. The first negative electrode 124a may be positioned between the first row R1 and the second row R2. The first negative electrode 124a may be electrically connected to the light source assemblies 140a1, 140a2, 140a3, 140a4, and 140a5 of the first row R1. Furthermore, the first negative electrode 124a may be electrically connected to the light source assemblies 140b1, 140b2, 140b3, 140b4, and 140b5 of the second row R2.

A second negative electrode 124b may be lengthily elongated along the third row R3. Alternatively, the second negative electrode 124b may be lengthily elongated along the x axis direction. The second negative electrode 124b may be separated from the first negative electrode 124a. The second negative electrode 124b may be positioned between the third row R3 and the fourth row R4. The second negative electrode 124b may be electrically connected to the light source assemblies 140c1, 140c2, 140c3, 140c4, and 140c5 of the third row R3. Furthermore, the second negative electrode 124b may be electrically connected to the light source assemblies 140d1, 140d2, 140d3, 140d4, and 140d5 of the fourth row R4.

A third negative electrode 124c may be lengthily elongated along the fifth row R5. Alternatively, the third negative electrode 124c may be lengthily elongated along the x axis direction. The third negative electrode 124c may be separated from the second negative electrode 124b. The third negative electrode 124c may be positioned between the fifth row R5 and the sixth row R6. The third negative electrode 124c may be electrically connected to the light source assemblies 140e1, 140e2, 140e3, 140e4, and 140e5 of the fifth row R5. Furthermore, the third negative electrode 124c may be electrically connected to the light source assemblies 140f1, 140f2, 140f3, 140f4, and 140f5 of the sixth row R6.

A first control electrode 125a may electrically serially connect the light source assemblies 140a1, 140a2, 140a3, 140a4, and 140a5 of the first row R1. A second control electrode 125b may electrically serially connect the light source assemblies 140b1, 140b2, 140b3, 140b4, and 140b5 of the second row R2. The most right light source assembly 140a5 of the first row R1 may be serially connected to the most right light source assembly 140b5 of the second row R2 through the control electrode 125. Alternatively, the first control electrode 125a and the second control electrode 125b may be electrically interconnected on the right side of the fifth column C5. Alternatively, the first light source assembly 140a5 and second light source assembly 140b5 of the fifth column C5 may be interconnected through the control electrode 125.

A third control electrode 125c may electrically serially connect the light source assemblies 140c1, 140c2, 140c3, 140c4, and 140c5 of the third row R3. A fourth control electrode 125d may electrically serially connect the light source assemblies 140d1, 140d2, 140d3, 140d4, and 140d5 of the fourth row R4. The most right light source assembly 140c5 of the third row R3 may be serially connected to the most right light source assembly 140d5 of the fourth row R4 through the control electrode 125. Alternatively, the third control electrode 125c and the fourth control electrode 125d may be electrically interconnected on the right side of the fifth column C5. Alternatively, the third light source assembly 140c5 and fourth light source assembly 140d5 of the fifth column C5 may be interconnected through the control electrode 125.

A fifth control electrode 125e may electrically serially connect the light source assemblies 140e1, 140e2, 140e3, 140e4, and 140e5 of the fifth row R5. A sixth control electrode 125f may electrically serially connect the light source assemblies 140f1, 140f2, 140f3, 140f4, and 140f5 of the sixth row R6. The most right light source assembly 140e5 of the fifth row R5 may be serially connected to the most right light source assembly 140f5 of the sixth row R6 through the control electrode 125. Alternatively, the fifth control electrode 125e and the sixth control electrode 125f may be electrically interconnected on the right side of the fifth column C5. Alternatively, the fifth light source assembly 140e5 and sixth light source assembly 140f5 of the fifth column C5 may be interconnected through the control electrode 125.

A control device may be electrically connected to the control electrode 125 through third cables Vb1 and Vb2. The third cables Vb1 and Vb2 may include an upper cable Vb1 and a lower cable Vb2. The upper cable Vb1 may be connected to the first control electrode 125a. The upper cable Vb1 may be connected to the first control electrode 125a on the left side of the first column C1. The lower cable Vb2 may be connected to the sixth control electrode 125f. The lower cable Vb2 may be connected to the sixth control electrode 125f on the left side of the first column C1.

A connector 150 may be positioned on the left side of the first column C1. The connector 150 may have conductivity. The connector 150 may include a first connector 151, a third connector 152 and a second connector 153.

The first connector 151 may be lengthily elongated along the first column C1. Alternatively, the first connector 151 may be lengthily elongated along the y axis direction. The first connector 151 may be electrically connected to the positive electrode 122. The first connector 151 may be electrically connected to the positive electrode of a power source device (not illustrated) through a first cable Va.

The third connector 152 may include an upper connector 152a and a lower connector 152b. The upper connector 150a and the lower connector 150b may be lengthily elongated along the first column C1. Alternatively, the upper connector 150a and the lower connector 150b may be lengthily elongated along the y axis direction. The upper connector 150a and the lower connector 150b may be spaced apart in the y axis direction. The third connector 152 may be separated from the first connector 151. The third connector 152 may be positioned on the right side of the first connector 151.

The second connector 153 may be lengthily elongated along the first column C1. Alternatively, the second connector 153 may be lengthily elongated along the y axis direction. The second connector 153 may be separated from the third connector 152. The second connector 153 may be positioned on the right side of the third connector 152. The second connector 153 may be electrically connected to the negative electrode 124. The second connector 153 may be electrically connected to the negative electrode of the power source device through the second cable Vc.

The first connector 151 to the second connector 153 may be positioned in order of the first connector 151, the third connector 152 and the second connector 153 along the +x axis direction. Order of the locations of the first connector 151 to the third connector 152 may be changed, if necessary.

Referring to FIG. 15, the first connector 151 may be separated from the base 110 in the +z axis direction. Alternatively, the first connector 151 may be spaced apart forward from the base 110.

The first connector 151 may be electrically connected to the positive electrode 122. Specifically, the first connector 151 may be connected to the first positive electrode 122a to the fourth positive electrode 122d. The first positive electrode 122a to the fourth positive electrode 122d may form one node through the first connector 151.

An electric current supplied from the positive electrode 122 of the power source device may be transmitted to the first positive electrode 122a to the fourth positive electrode 122d through the first connector 151.

Referring to FIG. 16, the third connector 152 may be separated from the base 110 in the +z axis direction. Alternatively, the third connector 152 may be separated forward from the base 110.

The third connector 152 may be electrically connected to the control electrode 125. Specifically, the upper connector 150a may connect the second control electrode 125b and the third control electrode 125c. Furthermore, the lower connector 150b may connect the fourth control electrode 125d and the fifth control electrode 125e.

Referring to FIG. 17, the second connector 153 may be separated from the base 110 in the +z axis direction. Alternatively, the second connector 153 may be separated from forward from the base 110.

The second connector 153 may be electrically connected to the negative electrode 124. Specifically, the second connector 153 may be connected to the first negative electrode 124a to the third negative electrode 124c. The first negative electrode 124a to the third negative electrode 124c may form one node through the second connector 153.

An electric current supplied from the positive electrode 122 of the power source device may flow into the negative electrode 124 of the power source device through the second connector 153.

The thickness, width or breadth of the electrode layer 120 formed on the base 110 may be formed very thinly. Accordingly, although the electrode layer 120 is formed on the base 110, the display device 100 may have light transparency. Alternatively, a reduction in the light transparency of the display device 100 attributable to the electrode layer 120 can be minimized.

If the thickness, width or breadth of the electrode layer 120 is formed very thinly, a cross-sectional area of the electrode layer 120 may be reduced, and electrical resistance of the electrode layer 120 may be increased. Furthermore, if the area of the display device 100 is increased, the length of the electrode layer 120 may be increased and electrical resistance of the electrode layer 120 may be increased. If electrical resistance of the electrode layer 120 is increased, power supplied from the power source device may not be uniformly supplied to the light source assembly 140. Alternatively, if electrical resistance of the electrode layer 120 is increased, a control signal transmitted by the control device may not be transmitted to the light source assembly 140.

Accordingly, a node may be formed on the left side of the first column C1 so that the electrode layer 120 can smoothly transmit power or a control signal to the light source assembly 140. By forming the node on the left side of the first column C1, the first positive electrode 122a to the fourth positive electrode 122d and the first negative electrode 124a to the third negative electrode 124c can receive power or a control signal through the node. The connector 150 may function as a node. The first connector 151 may function as a node that connects the first positive electrode 122a to the fourth positive electrode 122d. The second connector 153 may function as a node that connects the first negative electrode 124a to the third negative electrode 124c. The upper connector 152a of the third connector 152 may function as a node that connects the second control electrode 125b and the third control electrode 125c. The lower connector 152b of the third connector 152 may function as a node that connects the fourth control electrode 125d and the fifth control electrode 125e.

The connector 150 may be formed to have a greater thickness, width or breadth than the electrode layer 120. Accordingly, the connector 150 can have lower electrical resistance than the electrode layer 120, and can more smoothly transmit power or a control signal compared to the electrode layer 120.

Referring to FIGS. 18 and 19, a first resin 180 may be coated on the base 110, the electrode layer 120, the connector 150 and the light source assembly 140. For the bonding of the first resin 180 and the electrode layer 120, a primer process may be performed on the electrode layer 120. After the first resin 180 is coated on the base 110, the electrode layer 120, the connector 150 and the light source assembly 140, a thermosetting or photopolymer process may be performed. The first resin 180 may be formed into a first resin layer 181 through the thermosetting or photopolymer process.

The first resin layer 181 may surround the connector 150 or the light source assembly 140. Accordingly, the connector 150 or the light source assembly 140 may not be exposed to the outside. The connector 150 or the light source assembly 140 can be protected against an external impact through the first resin layer 181.

The first resin 180 may have a high viscosity characteristic. For example, the first resin 180 may be an optical clear resin (OCR). The first resin 180 may function as adhesives due to the high viscosity characteristic. For example, the first resin layer 181 may attach the display device 100 to the attachment surface 250.

Referring to FIGS. 20 to 22, a second resin 190 may be coated on the base 110, the electrode layer 120, the connector 150 and the light source assembly 140. For the bonding of the second resin 190 and the electrode layer 120, a primer process may be performed on the electrode layer 120. After the second resin 190 is coated on the base 110, the electrode layer 120, the connector 150 and the light source assembly 140, a thermosetting or photopolymer process may be performed. The second resin 190 may be formed into a second resin layer 191 through the thermosetting or photopolymer process.

After the second resin layer 191 is formed, a first resin 180 may be coated on the second resin layer 191. For the bonding of the first resin 180 and the second resin layer 191, a primer process may be performed on the second resin layer 191. After the first resin 180 is coated on the second resin layer 191, a thermosetting or photopolymer process may be performed. The first resin 180 may be formed in a first resin layer 181 through the thermosetting or photopolymer process.

The second resin layer 191 may surround the connector 150 or the light source assembly 140. Accordingly, the connector 150 or the light source assembly 140 may not be exposed to the outside. The connector 150 or the light source assembly 140 can be protected against an external impact through the second resin layer 191 or the first resin layer 181.

The first resin 180 may have a high viscosity characteristic. For example, the first resin 180 may be an optical clear resin (OCR). The first resin 180 may function as adhesives due to the high viscosity characteristic. For example, the first resin 180 may attach the display device 100 to the attachment surface 250.

The second resin 190 may be an optical clear resin (OCR). The adhesion of the first resin 180 may be greater than that of the second resin 190.

Referring to FIG. 23, display devices 100a and 100b may be formed in plural number. The plurality of display devices 100a and 100b may form left and right symmetry with respect to a symmetrical axis J.

The plurality of display devices 100a positioned on the left side of the symmetrical axis J may be arranged along the y axis direction. Each of the plurality of display devices 100a may be connected to a PCB 220a. The PCB 220a may be formed in plural number, and may be positioned to correspond to each of the display devices 100a. The connector 150 of each of the display devices 100a may be connected to the PCB 220a. A first connection unit 210 may electrically connect the connector 150 and the PCB 220a. A second connection unit 230 may electrically connect adjacent PCBs 220a. The lowest PCB 220a may be connected to a main board 240a. A third connection unit 231 may electrically connect the lowest PCB 220a and the main board 240a. The main board 240a may include a power board 241a and a control board 242a. The power board 241a may supply power, and the control board 242a may transmit a control signal.

The plurality of display devices 100b positioned on the right side of the symmetrical axis J may be arranged along the y axis direction. The plurality of display devices 100b may be connected to a PCB 220b. The PCB 220b may be formed in plural number, and may be positioned to correspond to each of the display devices 100b. The connector 150 of each of the display devices 100b may be connected to the PCB 220b. A first connection unit 210 may electrically connect the connector 150 and the PCB 220b. A second connection unit 230 may electrically connect adjacent PCBs 220b. The lowest PCB 220b may be connected to a main board 240b. A third connection unit 231 may electrically connect the lowest PCB 220b and the main board. The main board 240b may include a power board 241b and a control board 242b. The power board 241b may supply power, and the control board 242b may transmit a control signal.

Referring to FIG. 24, display devices 100a and 100b may be formed in plural number. The plurality of display devices 100a and 100b may form left and right symmetry with respect to a symmetrical axis K.

The plurality of display devices 100a positioned on the left side of the symmetrical axis K may be arranged along the y axis direction. Adjacent display devices 100a may be connected to one PCB 220a. The connector 150 of each of the display devices 100a may be connected to the PCB 220a. A first connection unit 210 may electrically connect the connector 150 and the PCB 220a. The lowest PCB 220a may be connected to a main board 240a. A third connection unit 231 may electrically connect the lowest PCB 220a and the main board 240a. The main board 240a may include a power board 241a and a control board 242a. The power board 241a may supply power, and the control board 242a may transmit a control signal.

The plurality of display devices 100b positioned on the right side of the symmetrical axis K may be arranged along the y axis direction. Adjacent display devices 100b may be connected to one PCB 220b. The connector 150 of each of the display devices 100b may be connected to a PCB 220b. A first connection unit 210 may electrically connect the connector 150 and the PCB 220b. A second connection unit 230 may electrically connect adjacent PCBs 220b. The lowest PCB 220b may be connected to the main board 240b. A third connection unit 231 may electrically connect the lowest PCB 220b and the main board. The main board 240b may include a power board 241b and a control board 242b. The power board 241b may supply power, and the control board 242b may transmit a control signal.

The aforementioned embodiments of the disclosure are not exclusive or different. The elements or functions of each of the aforementioned embodiments of the disclosure may be used in combination with or combined with each other.

The detailed description should not be construed as being limitative, but should be considered to be illustrative from all aspects. The scope of the disclosure should be determined by reasonable analysis of the attached claims, and all changes within the equivalent scope of the disclosure are included in the scope of the disclosure.

The invention claimed is:

1. A display device, comprising:
   a light-transmissive substrate including one surface;
   a first positive electrode formed on the one surface and lengthily elongated;
   a first negative electrode formed on the one surface and opposite the first positive electrode;
   a second negative electrode formed on the one surface, opposite the first positive electrode, and positioned between the first positive electrode and the first negative electrode;
   a second positive electrode formed on the one surface, opposite the second negative electrode, and positioned between the second negative electrode and the first negative electrode;
   first light sources mounted on the one surface and positioned between the first positive electrode and the second negative electrode;
   second light sources mounted on the one surface and positioned between the second negative electrode and the second positive electrode;
   third light sources mounted on the one surface and positioned between the second positive electrode and the first negative electrode;
   a first connector spaced apart from the one surface, facing the one surface, and connecting the first positive electrode and the second positive electrode; and
   a second connector spaced apart from the one surface, facing the one surface, and connecting the first negative electrode and the second negative electrode.

2. The display device of claim 1,
   wherein the first connector and the second connector are positioned on one side of the first light sources, the second light sources, and the third light sources.

3. The display device of claim 2,
wherein the first positive electrode and the second positive electrode are connected on the other side of the first light sources, the second light sources, and the third light sources.

4. The display device of claim 3, further comprising:
a third positive electrode formed on the one surface, opposite the first negative electrode, and positioning the first negative electrode between the third positive electrode and the second positive electrode;
fourth light sources mounted on the one surface and positioned between the first negative electrode and the third positive electrode;
a first switching electrode formed on the one surface to serially connect the first light sources;
a second switching electrode formed on the one surface to serially connect the second light sources;
a third switching electrode formed on the one surface to serially connect the third light sources;
a fourth switching electrode formed on the one surface to serially connect the fourth light sources; and
a third connector spaced apart from the one surface, facing the one surface, and connecting the second switching electrode and the third switching electrode,
wherein the first switching electrode and the second switching electrode are connected on the other side of the first light sources, the second light sources, the third light sources, and the fourth light sources, and
wherein the third switching electrode and the fourth switching electrode are connected on the other side of the first light sources, the second light sources, the third light sources, and the fourth light sources.

5. The display device of claim 4,
wherein the first connector is connected to the third positive electrode, and
wherein the first positive electrode, the second positive electrode, and the third positive electrode are connected on the other side of the first light sources, the second light sources, the third light sources, and the fourth light sources.

6. The display device of claim 4, further comprising:
a fourth positive electrode formed on the one surface, opposite the third positive electrode, and positioning the third positive electrode between the fourth positive electrode and the first negative electrode;
a third negative electrode formed on the one surface, opposite the fourth positive electrode, and positioned between the third positive electrode and the fourth positive electrode;
fifth light sources mounted on the one surface and positioned between the third positive electrode and the third negative electrode;
sixth light sources mounted on the one side and positioned between the third negative electrode and the fourth positive electrode;
a fifth switching electrode formed on the one side to serially connect the fifth light sources;
a sixth switching electrode formed on the one side to serially connect the sixth light sources; and
a fourth connector spaced apart from the one side, facing the one side, and connecting the fourth switching electrode and the fifth switching electrode,
wherein the fifth switching electrode and the sixth switching electrode are connected on the other side of the first light sources, the second light sources, the third light sources, the fourth light sources, the fifth light sources, and the sixth light sources.

7. The display device of claim 6,
wherein the fourth connector is spaced in a length direction of the third connector.

8. The display device of claim 1, further comprising:
a power source device;
a first cable connecting the power source device and the first connector; and
a second cable connecting the power source device and the second connector.

9. The display device of claim 8, further comprising:
a first resin layer formed on the substrate,
wherein the first connector and the second connector are positioned within the first resin layer.

10. The display device of claim 8, further comprising:
a second resin layer formed on the substrate; and
a first resin layer formed on the second resin layer,
wherein the first connector and the second connector are positioned within the second resin layer.

* * * * *